(12) United States Patent
Weiland

(10) Patent No.: US 9,134,391 B2
(45) Date of Patent: Sep. 15, 2015

(54) MAGNETIC RESONANCE METHOD AND SYSTEM TO DETECT INTERFERENCE SIGNALS IN MAGNETIC RESONANCE SPECTROSCOPY SIGNALS

(75) Inventor: Elisabeth Weiland, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 656 days.

(21) Appl. No.: 13/422,210

(22) Filed: Mar. 16, 2012

(65) Prior Publication Data

US 2012/0235683 A1    Sep. 20, 2012

(30) Foreign Application Priority Data

Mar. 16, 2011 (DE) .......................... 10 2011 005 614

(51) Int. Cl.
| | |
|---|---|
| *G01R 33/44* | (2006.01) |
| *G01R 33/46* | (2006.01) |
| *G01R 33/485* | (2006.01) |
| *G01R 33/565* | (2006.01) |

(52) U.S. Cl.
CPC .......... *G01R 33/4625* (2013.01); *G01R 33/485* (2013.01); *G01R 33/565* (2013.01)

(58) Field of Classification Search
CPC ............. G01R 33/4625; G01R 33/565; G01R 33/485; G01R 33/56563; G01R 33/56; G01R 33/5659; G01R 33/56536
USPC ........................... 324/300–322; 600/407–422
See application file for complete search history.

(56) References Cited

U.S. PATENT DOCUMENTS

| | | | | |
|---|---|---|---|---|
| 5,572,125 A | * | 11/1996 | Dunkel | ......................... 324/307 |
| 2005/0137476 A1 | | 6/2005 | Weiland | |
| 2009/0102481 A1 | * | 4/2009 | Haacke | ......................... 324/318 |

OTHER PUBLICATIONS

Mierisova et al., "MR spectroscopy quantitation: a review of frequency domain methods," NMR Biomed., vol. 14 (2001), pp. 247-259.
van den Boogaart et al., "SVD-Based Quantification of Magnetic Resonance Signals," Journal of Magnetic Resonance, vol. 97 (1992), pp. 122-133.
Cabanes et al., "Optimization of Residual Water Signal Removal by HLSVD on Simulated Short Echo Time Proton MR Spectra of the Human Brain," Journal of Magnetic Resonance, vol. 150 (2001), pp. 116-125.
Jiru, "Introduction to post-processing techniques," European Journal of Radiology, vol. 67 (2008), pp. 202-217.
Provencher, "Automatic quantitation of localized in vivo H spectra with LCModel," NMR Biomed., vol. 14 (2001), pp. 260-264.
Chang et al., "Robust baseline correction algorithm for signal dense NMR spectra," Journal of Magnetic Resonance, vol. 187 (2007), pp. 288-292.

* cited by examiner

*Primary Examiner* — Melissa Koval
*Assistant Examiner* — Rishi Patel
(74) *Attorney, Agent, or Firm* — Schiff Hardin LLP

(57) ABSTRACT

In a method and device to detect interference signals in magnetic resonance spectroscopy signals a comparison signal is computationally reconstructed that optimally approximates a measured, detected magnetic resonance spectroscopy signal. The comparison signal forms spectral components of resonance lines of the measured magnetic resonance spectroscopy signal. A residual is calculated from the difference of the two signals (comparison signal and magnetic resonance spectroscopy signal) in the frequency representation. The interference signals are determined from the residual.

18 Claims, 5 Drawing Sheets

Magnetic resonance spectra

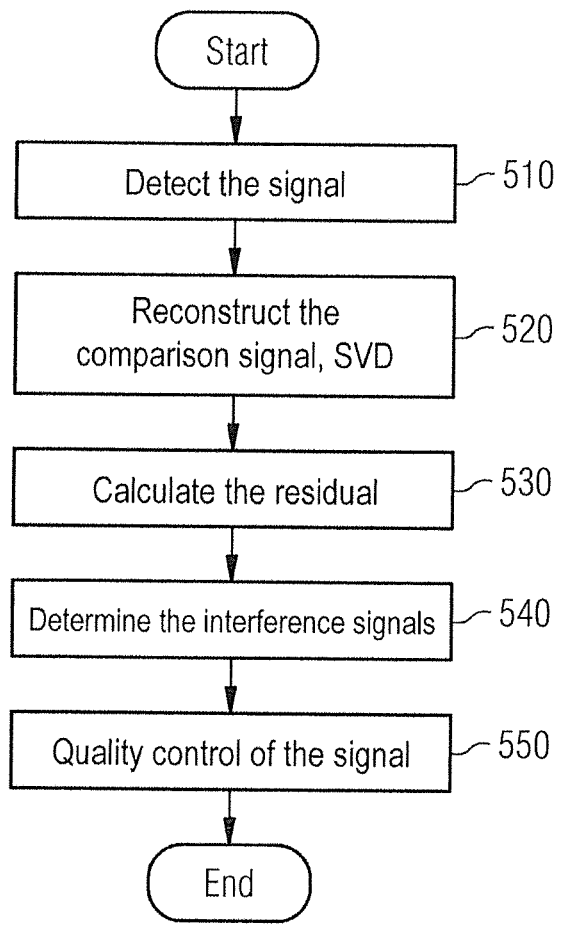

MAGNETIC RESONANCE METHOD AND SYSTEM TO DETECT INTERFERENCE SIGNALS IN MAGNETIC RESONANCE SPECTROSCOPY SIGNALS

BACKGROUND OF THE INVENTION

1. Field of the Invention

The present invention concerns a method and system in order to detect interference signals that occur in the form of spikes in the frequency representation of magnetic resonance spectroscopy signals.

2. Description of the Prior Art

In magnetic resonance spectroscopy signals, unwanted interference signals are sometimes present that are recognizable in the form of spikes in the frequency representation of the spectroscopy signal. These interference signals occur due to non-optimal residual magnetization suppression, for example, during the spectroscopic signal acquisition.

These interference signals can hinder the signal evaluation of the usable signal because such spikes could be erroneously perceived as resonance lines of the usable signal, and such spikes may overlay the resonance lines of the usable signal so that they are not distinctly recognizable as interference signals but severely adulterate the usable signal. These spikes can therefore impede or make impossible an evaluation of the acquired spectra.

An evaluation of magnetic resonance spectroscopy signals with regard to interference signals has previously been conducted in a purely visual fashion. This requires a great deal of care and experience on the part of the persons who evaluate the data. Persons with less experience in the data evaluation of magnetic resonance spectra are therefore incapable of sufficiently assessing and interpreting the data.

For this reason, it is desirable to represent or identify possible interference signals so unambiguously that the corresponding evaluation and assessment of the spectra is not dependent on the experience and care of the evaluating personnel. Furthermore, via the presentation and analysis of the interference signals with regard to a measured magnetic resonance spectroscopy signal, it is desirable to be able to make a decision as to whether this is suitable for a further evaluation or not.

SUMMARY OF THE INVENTION

An object of the present invention is to detect interference signals that occur in the form of spikes in magnetic resonance spectroscopy signals by providing computerized assistance or support to make the spikes more readily identifiable as interference spikes.

This object is achieved in accordance with the present invention by a computerized method to detect interference signals in a magnetic resonance spectroscopy signal. The method includes the following steps that are automatically implemented in a processor.

A comparison signal is reconstructed, i.e. a comparison signal is generated computationally that, for example, is formed as a sum of exponential functions and recreates the measured magnetic resonance spectroscopy signal as well as possible. In particular, the corresponding mathematical representation of the comparison signal by a frequency representation allows a simple determination of characteristic resonance lines of the examined substances. The magnetic resonance spectroscopy signal and the comparison signal can be presented and processed either in the time domain or in the frequency domain.

A residual is calculated as the difference of the two signals, namely the measured magnetic resonance spectroscopy signal and the reconstructed comparison signal. The residual in the frequency representation therefore includes signal portions that are not represented by the reconstructed signal.

The interference signals are determined from the residual. Since the reconstructed comparison signal advantageously includes all resonance lines acquired in the measured magnetic resonance spectroscopy signal that can be associated with the examined substances, unwanted signal portions in the residual, such as noise or interference signals, are represented in the frequency representation in the form of spikes.

In particular, the noise signal in the residual can be analyzed by calculation; spike-shaped signal portions in the frequency representation of the residual which can lie well above the noise can be identified as interference signals in the form of spikes. The noise in the residual can be calculated for this purpose. One possibility is the calculation of a standard deviation of the noise in the residual. Instead of the standard deviation, the variance of the noise can be used, for example. A threshold for possible interference signals can therefore be established. Signals in the residual that are higher than the established threshold thus can be identified with more certainty as interference signals. The identification of the interference signals in the form of spikes can take place not only directly, visually from the frequency representation, but also automatically with a corresponding algorithm. Furthermore, by the evaluation of the interference signals this algorithm can produce an output in the form of an evaluation of the signal quality of the magnetic resonance spectroscopy signal and provide indications of errors in the measurement procedure.

For the reconstruction of a comparison signal, the measured magnetic resonance spectroscopy signal is decomposed—via the singular value decomposition (SVD) algorithm, for example—into corresponding eigenvalues. Furthermore, methods such as Hankel Singular Value Decomposition (NSVD) or Linear Prediction Singular Value Decomposition (LPSVD) can also be used.

Furthermore, the reconstruction of the comparison signal can already be related to a reduced frequency range. For example, this reduced frequency range can be established in a range in which specific expected resonance lines of the examined substances lie.

The method can also be used as an additional analysis method in imaging magnetic resonance tomography. The magnetic resonance spectroscopy signals can be acquired from specific, spatially established regions (known as voxels). The respective magnetic resonance spectroscopy signal with its resonance lines characteristic of specific substances can therefore be associated with a specific spatial region. At the same time, via the imaging method of magnetic resonance tomography, the respective spatial region can also be graphically depicted in the magnetic resonance tomography exposure.

The invention also encompassed a device to detect interference signals in a magnetic resonance spectroscopy signal. This device has an importation unit to receive a magnetic resonance spectroscopy signal, a computer configured to reconstruct the comparison signal from the measured magnetic resonance spectroscopy signal and to calculate the residual via the difference of measured magnetic resonance spectroscopy signal and the reconstructed comparison signal. Furthermore, the device has an analysis unit configured to show and/or correspondingly evaluate the residual in the frequency representation.

The importation unit can receive the data from a detector of a magnetic resonance tomography scanner (data acquisition unit), for example.

The computer is preferably designed (programmed or constructed) so that a comparison signal is generated computationally, this comparison signal being formed as a sum of exponential functions that recreates the measured magnetic resonance spectroscopy signal as well as possible. This leads to the situation that the computational representation of the comparison signal in the frequency representation allows a relatively simple determination of characteristic resonance lines of the examined substances. The reconstruction of the comparison signal can also be related to a reduced frequency range. For example, this reduced frequency range can be established in a range in which specific expected resonance lines of the examined substances lie.

Furthermore, the analysis unit is designed so that it computationally analyzes a noise signal in the residual and can thereby identify spike-shaped signal portions in the frequency representation of the residual that lie well above the noise as interference signals. The analysis unit can calculate a standard deviation of the noise signal in the residual, for example. A threshold can thus be established via this standard deviation. Spike-shaped signals in the frequency representation of the residual which exceed the established threshold thus can be identified as interference signals by the analysis unit.

The device according to the invention can also be a component of a system for imaging magnetic resonance tomography. The system, together with the device according to the invention, therefore allows magnetic resonance spectroscopy signals to be acquired from defined, spatially established regions (voxels). The system for imaging magnetic resonance tomography, together with the device according to the invention, therefore allows a defined, measured magnetic resonance spectroscopy signal with its resonance lines characteristic of a specific substance to be associated with a specific spatial region. At the same time, the system also allows a graphical representation of the respective spatial regions in a magnetic resonance tomography exposure.

Furthermore, the present invention encompasses a non-transitory, computer-readable storage medium encoded with instructions (a computer program or a software) that can be loaded into a memory of a programmable control device to evaluate the magnetic resonance spectroscopy signals. All or various embodiments of the method according to the invention that are described above preceding can be executed by these encoded instructions when run in the control device to evaluate the magnetic resonance spectroscopy signals. The encoded instructions may possibly require program means (libraries and auxiliary functions, for example) in order to realize the corresponding embodiments of the method. The encode instructions can be source code (C++, for example) that must still be compiled (translated) and linked or that only needs to be interpreted, or it can be an executable software code that has only to be loaded into the corresponding computer for execution. This software can be a component of a control or evaluation device of an imaging magnetic resonance tomography system or software to evaluate magnetic resonance spectroscopy signals.

The present invention therefore offers the advantage that interference signals in which no or little usable signals are analyzed and presented directly in a spectrum representation of the residual, such that the interfere signals are significantly more unambiguously recognizable than in the acquired spectrum of the measured magnetic resonance spectroscopy signal.

Furthermore, via the presentation and analysis of the interference signals in a measured magnetic resonance spectroscopy signal the present invention allows a decision as to whether this is suitable for a further evaluation or not. For example, via the present invention the quality of the magnetic resonance spectroscopy signals can be checked automatically by software. Spectra in which interference signals are detected in the form of spikes would thus be marked as poor and be removed from further handling and the results presentation. More reliable results can be obtained in this manner, and the labor cost to create a finding can be reduced. Software in accordance with the invention for automatic testing of the quality of magnetic resonance spectroscopy signals can be integrated into software of a device for imaging magnetic resonance tomography, or into a corresponding software for post-processing of such signals.

BRIEF DESCRIPTION OF THE DRAWINGS

FIG. 5 is a flowchart of an embodiment of the method according to the invention for detection of interference signals in a magnetic resonance spectroscopy signal.

DESCRIPTION OF THE PREFERRED EMBODIMENTS

Figure 1:
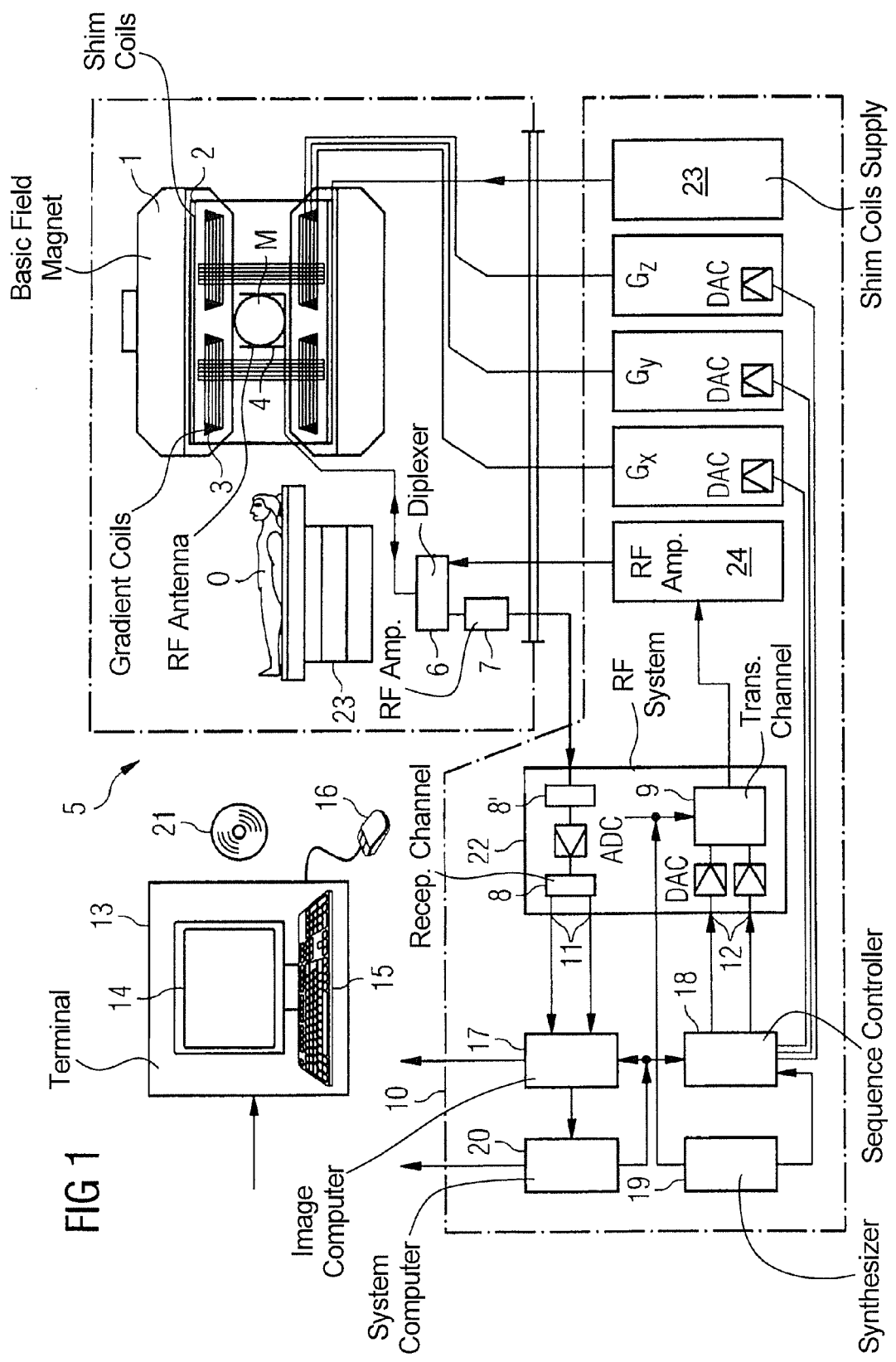
FIG. 1 schematically illustrates a magnetic resonance system operable according to the invention.

FIG. 1 schematically illustrates a magnetic resonance system 5 that can be used both for imaging magnetic resonance tomography and for magnetic resonance spectroscopy. A basic magnetic field magnetic 1 generates a temporally constant, strong magnetic field for polarization or alignment of the nuclear spins in an examination region of a subject O, for example of a portion of a human body that is to be examined. This subject O, situated on a table 23, is moved into the magnetic resonance system 5 for data acquisition. The high homogeneity of the basic magnetic field that is required for the magnetic resonance measurement (data acquisition) is defined in a measurement volume M. Shim plates made of ferromagnetic material are mounted at a suitable point to assist the homogeneity requirements, in particular to eliminate temporally invariable influences. Temporally variable influences are eliminated by shim coils 2 supplied with signals from a shim coil supply 23.

A cylindrical gradient coil system 3 composed of three sub-windings is located in the basic field magnet 1. Each sub-winding is supplied with current by an amplifier to generate a linear (and temporally variable) gradient field in the respective direction of the Cartesian coordinate system. The first sub-winding of the gradient field system 3 generates a gradient $G_x$ in the x-direction; the second sub-winding generates a gradient $G_y$ in the y-direction; and the third sub-winding generates a gradient $G_z$ in the z-direction. Each amplifier has a digital/analog converter that is activated by a sequence controller 18 for accurately timed generation of gradient pulses.

One (or more) radio-frequency antennas 4, which convert the radio-frequency pulses emitted by a radio-frequency power amplifier into an alternating magnetic field for excitation of the nuclei and alignment of the nuclear spins of the subject O or region to be examined, are located within the gradient field system 3. Each radio-frequency antenna 4 has one or more RF transmission coils and one or more RF reception coils in the form of an annular, advantageously linear or matrix-like arrangement of component coils. The alternating field emanating from the precessing nuclear spins—normally the nuclear spin echo signals caused by a pulse sequence composed of one or more radio-frequency pulses and one or more gradient pulses—is also converted by the RF reception coils of the respective radio-frequency antenna 4 into a voltage (measurement signal) that is supplied via an amplifier 7 to a radio-frequency reception channel 8 of a radio-frequency system 22. The radio-frequency system 22 furthermore has a transmission channel 9 in which the radio-frequency pulses are generated for the excitation of the nuclear spins. The respective radio-frequency pulses are digitally represented in the sequence controller 18 as a series of complex numbers based on a pulse sequence predetermined by the system computer 20. This number sequence is supplied as a real part and imaginary part to a digital/analog converter in the radio-frequency system 22 via respective inputs 12 and from the digital/analog converter to the transmission channel 9. In the transmission channel 9, the pulse sequences are modulated on a radio-frequency carrier signal whose base frequency corresponds to the resonance frequency of the nuclear spins in the measurement volume.

The switching from transmission operation to reception operation takes place via a transmission/reception diplexer 6. The RF transmission coils of the radio-frequency antenna(s) 4 radiate(s) the radio-frequency pulses, supplied from an RF amplifier 24, for excitation of the nuclear spins into the measurement volume M and scans resulting echo signals via the RF reception coil(s). The correspondingly acquired magnetic resonance signals are phase-sensitively demodulated at an intermediate frequency in the reception channel 8' (first demodulator) of the radio-frequency system 22 and digitized in an analog/digital converter (ADC). This signal is further demodulated to a frequency of 0. The demodulation to a frequency of 0 and the separation into real part and imaginary part occurs in a second demodulator 8 after the digitization in the digital domain. An MR image can be reconstructed by the image computer 17 from the measurement data acquired in such a manner. The administration of the measurement data, the image data and the control programs takes place via the system computer 20. Based on a specification with control programs, the sequence controller 18 monitors the generation of the respective desired pulse sequences and the corresponding scanning of k-space. The sequence controller 18 controls the accurately-timed switching of the gradients, the emission of the radio-frequency pulses with defined phase amplitude, and the reception of the magnetic resonance signals. The time base for the radio-frequency system 22 and the sequence controller 18 is provided by a synthesizer 19. The selection of corresponding control programs to generate an MR image (which control programs are stored on a DVD 21, for example) and the presentation of the generated MR image take place via a terminal 13 that has a keyboard 15, a mouse 16 and a monitor 14.

A method based on magnetic resonance with which biochemical observations can be conducted with spatial resolution in a volume element is designated as magnetic resonance spectroscopy. Such a method is often used together with imaging magnetic resonance tomography and differs from imaging significantly in that, in addition to the spatial resolution as in imaging, the chemical shift is also resolved and presented in the form of a spectrum.

As is known, a chemical shift in NMR spectroscopy is the distance of a resonance line of the sample from the resonance line of a reference signal to which the chemical shift 0 is assigned. The cause of the chemical shift is the magnetic susceptibility of the electrons that orbit the respective atomic nucleus. This leads to a partial shielding of the external magnetic field by the electrons, and therefore also to a corresponding change of the nuclear magnetic resonance frequency. If the atom is part of a molecule, the electron density (and therefore the shielding effect by the neighboring atoms) is affected. Therefore, individual substituents or functional groups can be identified in an NMR spectrum. In particular, different chemical substances such as metabolites (intermediate products of metabolic processes) in living tissue can be identified and quantified with magnetic resonance spectroscopy based on their chemical shift.

The chemical shift (independent of the magnetic field strength of the spectrometer that is used) is typically specified in ppm (parts per million).

In magnetic resonance spectroscopy, measurements are most often conducted by exciting hydrogen nuclei that are best accessible via nuclear magnetic resonance tomography and that are present in large quantities in biological tissues; measurements of phosphorus or carbon atoms are also conducted, but more rarely. In the acquisition of spectra of hydrogen nuclei, a large interference signal can arise that is generated by protons bound in water in the subject. This interference signal can be suppressed with special methods of excitation; and/or it can subsequently be reduced out of the acquired spectra via corresponding mathematical methods.

In magnetic resonance spectroscopy, a specific volume (that has previously been positioned in overview images) can be examined and analyzed in physical tissue. This method is also designated as single voxel spectroscopy (SVS). It is also possible to measure multiple voxels simultaneously, wherein a larger, localized volume is subdivided into multiple small volumes via phase coding. This method is called multi-voxel spectroscopy or chemical shift imaging, and can be executed in two or three dimensions.

Figure 2:
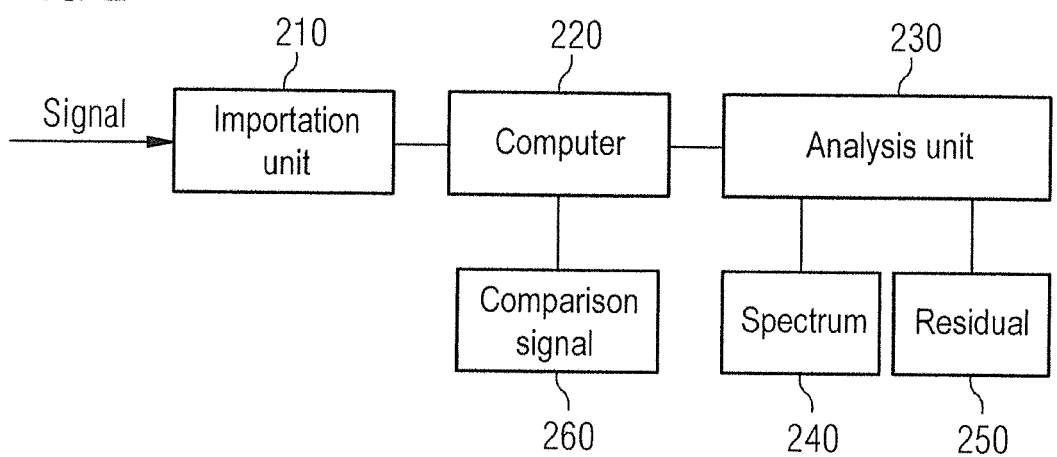
FIG. 2 is a block diagram of an embodiment of a device according to the invention for detection and analysis of magnetic resonance spectroscopy signals.

FIG. 2 schematically shows a device to acquire and analyze magnetic resonance spectroscopy signals. The measured magnetic resonance signal is received by an importation unit 210 and supplied to a computer 220. The importation unit 210 can be a system to import magnetic resonance spectroscopy signals. The computer 220 determines an associated spectrum 240 in the frequency range from the acquired signal; furthermore, the computer 220 determines a comparison signal 260 via a reconstruction method. The comparison signal 260 is reconstructed as a sum of exponential functions, for example, and should recreate the measured magnetic resonance spectroscopy signal as well as possible. The examined substances can thereby be determined relatively simply from the computational presentation of the comparison signal 260 in the frequency presentation. Furthermore, the computer 220 determines the residual 250 via the difference of measured magnetic resonance spectroscopy signal and the reconstructed comparison signal 260. Furthermore, the device comprises an analysis unit 230 which shows and/or accordingly evaluates the residual calculated by the computer 220 in the frequency presentation.

The comparison signal normally only mathematically recreates potential resonance lines of substances; therefore, signal portions from the measured magnetic resonance spectroscopy signal that are not due to resonance lines are often also not depicted in the comparison signal 260. These signal portions that are not depicted can be composed of a noise portion and other interference signals. Since the residual 250 is calculated from the difference of the magnetic resonance spectroscopy signal and the comparison signal 260, it is primarily composed of noise portions and other interference signals that are not depicted in the reconstructed comparison signal.

Furthermore, the analysis unit 230 can be designed so that it computationally analyzes a noise signal in the residual 250 and can thereby detect spike-shaped interference signal portions in the frequency representation of the residual 250. In particular, spike-shaped signal portions are detected as an interference signal when they lie well above the noise signals in terms of their amplitude. The analysis unit 230 can thereby implement a detection of interference signals, for example above a standard deviation from the noise signal level in the residual 250. In particular, a threshold for spike-shaped interference signals can be established via this standard deviation. A detection is also possible with Fourier analysis. Interference signals in the frequency representation of the residual 250 which exceed the established threshold can thus be identified by the analysis unit as interference signals.

Figure 3:
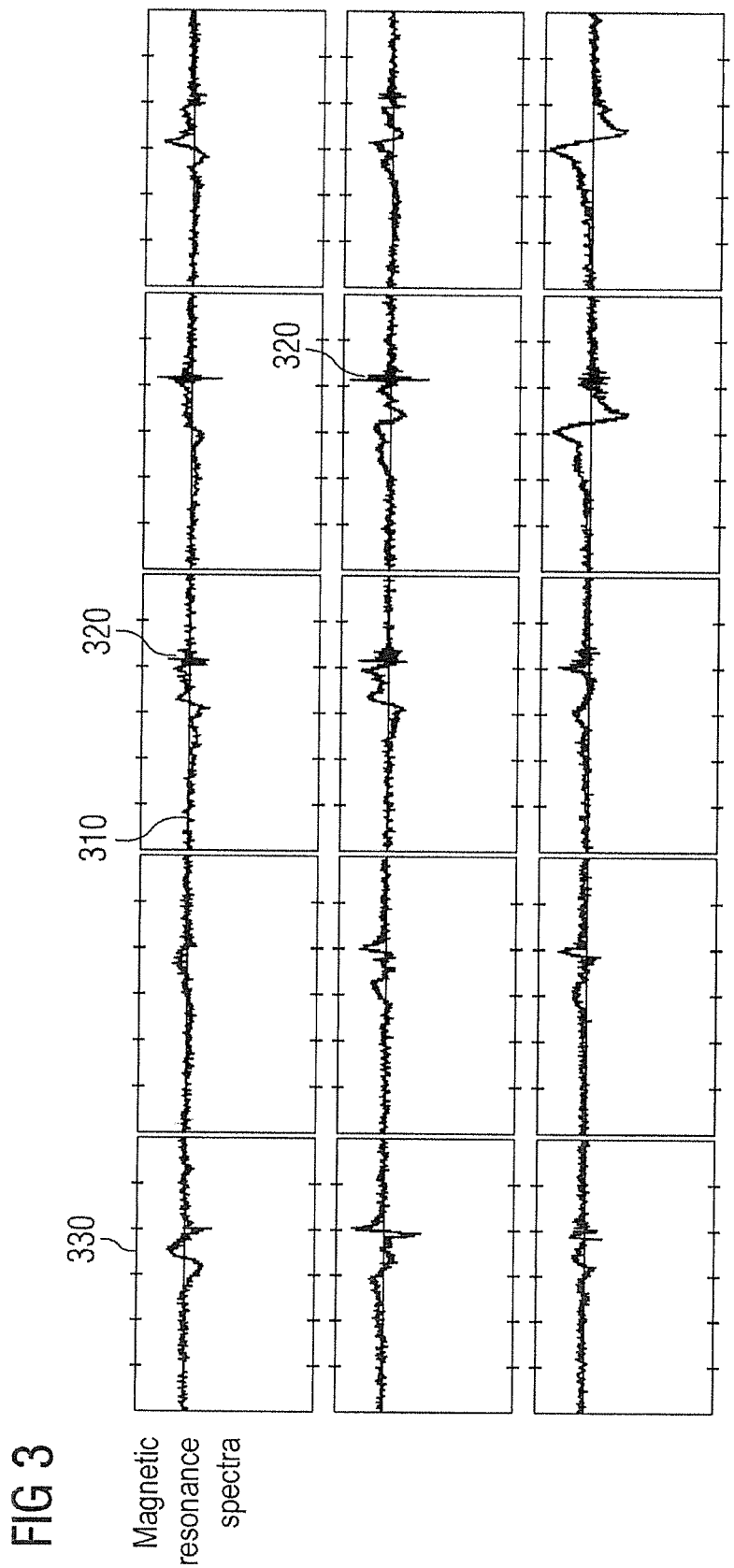
FIG. 3 shows the spectra of magnetic resonance spectroscopy signals are depicted with resonance lines, noise portions and interference signals.

FIG. 3 shows various spectra of magnetic resonance spectroscopy signals with resonance lines, noise and interference signals. Each partial image 330 shows the spectrum of a voxel, i.e. a limited, defined spatial tissue segment. The spectrum primarily contains noise portions in region 310, while 320 depicts a spike-shaped interference signal. Such interference signals 320 differ from typical resonance lines in that they do not exhibit their typical shape and therefore cannot be depicted via Gaussian, Lorentzian or Voigt lines.

Figure 4:
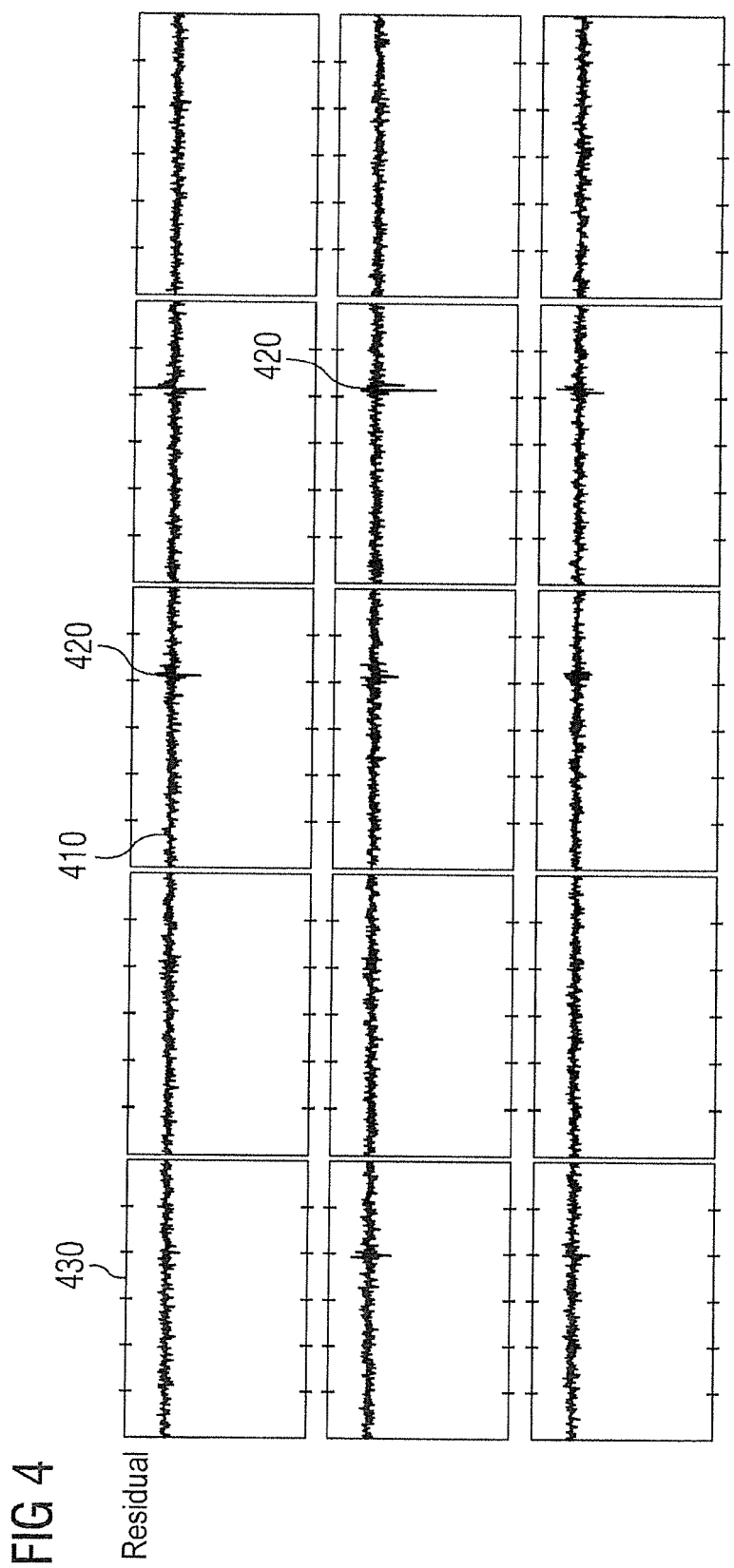
FIG. 4 shows the spectra of residuals of the magnetic resonance spectroscopy signals of FIG. 3.

FIG. 4 shows different spectra of residuals of the magnetic resonance spectroscopy signals of FIG. 3. Each individual partial image 430 here shows the corresponding residual of a voxel which corresponds to the respective voxel from FIG. 3 and was calculated from the difference of the magnetic resonance spectroscopy signal and the comparison signal. Corresponding to the reconstruction of the comparison signal and the difference calculation between magnetic resonance spectroscopy signal and comparison signal, the residual primarily contains noise signals 410 and spike-shaped interference signals 420 that correspond to the corresponding signals 310 and 320 from FIG. 3.

FIG. 5 shows a flowchart of an embodiment of the method according to the invention for the detection 510 of interference signals in a magnetic resonance spectroscopy signal.

In a first Step 510, the magnetic resonance spectroscopy signal to be measured is initially received and stored by the importation unit.

In a second Step 520, a comparison signal is reconstructed which approximates the measured and recorded magnetic resonance spectroscopy signal as well as possible. The magnetic resonance spectroscopy signal and the comparison signal can be presented and processed either in the time domain or in the frequency domain. The comparison signal thereby recreates spectral components of resonance lines in the measured magnetic resonance spectroscopy signal.

In a third Step 530, a residual of the difference of the magnetic resonance spectroscopy signal and the comparison signal is calculated in the frequency presentation.

In a fourth Step 540, the interference signals are determined in the frequency presentation of the calculated residual. In particular, in a preferred embodiment spike-shaped interference signals of noise signals can be differentiated in that the amplitudes of these signals exceed a threshold. This threshold can in turn be calculated from the standard deviation of the noise signal.

In a fifth Step 550, the quality of the magnetic resonance spectroscopy signal is checked and evaluated using the determined interference signals. For example, the quality can be evaluated via both the number and the magnitude of the individual interference signals of a magnetic resonance spectroscopy signal. Magnetic resonance spectroscopy signals which fall below a predetermined minimum quality can advantageously be marked or excluded from the additional evaluation via an automated process. Such an automated process is in particular advantageous when many magnetic resonance spectroscopy signals of individual voxels have been measured once and should be jointly post-processed. Measurement artifacts arising due to interference signals can thereby lead to false total results. By excluding magnetic resonance spectroscopy signals with poor quality, a total result of many individual voxels can be improved. For example, a metabolite image can be coded as a color curve in the distribution of the signal intensity of a defined peak of the spectra (that is characteristic of a specific substance, for example) across all voxels and then be superimposed on an existing image of a nuclear magnetic spectroscopy exposure. In this way the determined concentration of the metabolites is superimposed as a respective color on the nuclear magnetic resonance spectroscopy exposure, such that the determined concentrations can be associated with a location in the exposure and the metabolite distribution can be presented. By excluding magnetic resonance spectroscopy signals with poor quality, it is achieved that false signal intensities due to interference signals do not lead to a false image impression.

Although modifications and changes may be suggested by those skilled in the art, it is the intention of the inventor to embody within the patent warranted hereon all changes and modifications as reasonably and properly come within the scope of her contribution to the art.

I claim as my invention:

1. A method to detect interference signals in a magnetic resonance spectroscopy signal, comprising:
    providing a processor with at least one magnetic resonance spectroscopy signal, which contains interference signals and, in said processor, reconstructing a comparison signal from said magnetic resonance spectroscopy signal that approximates said magnetic resonance spectroscopy signal by recreating spectral components of resonance lines in said magnetic resonance spectroscopy signal and that does not include spectral components of said interference signals;
    in said processor, calculating a residual of a difference between said magnetic resonance spectroscopy signal and said comparison signal in frequency representation (b), said residual containing signal spikes in a degree correlated with said interference signals;
    from said processor emitting an electrical signal that represents the frequency representation of said residual; and
    from said signal spikes in said residual represented in said electronic signal, determining said interference signals.

2. A method as claimed in claim 1 comprising determining said interference signals in said processor by executing an algorithm configured to detect said interference signals in said frequency representation of said residual.

3. A method as claimed in claim 1 comprising determining said interference signals by presenting a visual display of said residual at a display screen in a form allowing manual evaluation of the displayed residual.

4. A method as claimed in claim 1 comprising reconstructing said comparison signal by implementing an eigenvalue decomposition of said magnetic resonance spectroscopy signal in the time domain, and generating said comparison signal as a sum of exponential functions.

5. A method as claimed in claim 4 comprising implementing an algorithm for said eigenvalue decomposition selected from the group consisting of Hankel Singular Value Decomposition (HSVD) and Linear Prediction Single Value Decomposition (LPSVD).

6. A method as claimed in claim 1 comprising determining said interference signals by implementing a mathematical analysis of said residual comprising identifying said interference signal as existing in said residual when a range of said residual exceeds a threshold, and determining said threshold in said processor using a noise signal portion of said magnetic resonance spectroscopy signal.

7. A method as claimed in claim 6 comprising determining said threshold in said processor by calculating the standard deviation of said noise signal portion.

8. A method as claimed in claim 1 comprising, in said processor, reconstructing said comparison signal from only a range of a frequency spectrum of said magnetic resonance spectroscopy signal in which resonance lines are expected.

9. A method as claimed in claim 1 comprising providing a plurality of magnetic resonance spectroscopy signals to said processor and, for each of said magnetic resonance spectroscopy signals, reconstructing said comparison signal, calculating said residual, and determining said interference signals therein and evaluating a quality of said plurality of magnetic resonance spectroscopy signals by identifying a proportion of said plurality of magnetic resonance spectroscopy signals for which said interference signals exceed a predetermined value.

10. A method as claimed in claim 9 comprising acquiring said plurality of magnetic resonance spectroscopy signals respectively from narrowly spatially limited tissue regions of a subject, and respectively directly associating the magnetic resonance spectroscopy signals with the spatially limited tissue region from which the magnetic resonance spectroscopy signals were respectively acquired.

11. A device to detect interference signals in a magnetic resonance spectroscopy signal, comprising:
an importation unit provided with at least one magnetic resonance spectroscopy signal, which contains interference signals;
a reconstruction unit in communication with said importation unit and configured to reconstruct a comparison signal from said magnetic resonance spectroscopy signal that approximates said magnetic resonance spectroscopy signal by recreating spectral components of resonance lines in said magnetic resonance spectroscopy signal and that does not include spectral components of said interference signals;
a processor configured to calculate a residual of a difference between said magnetic resonance spectroscopy signal and said comparison signal in frequency representation, said residual containing signal spikes in a degree correlated with said interference signals;
said processor being configured to emit an electrical signal that represents the frequency representation of said residual; and
an analysis unit provided with said electrical signal and configured to determine said interference signals from said signal spikes in said residual represented in said electrical signal.

12. A device as claimed in claim 11 wherein said reconstruction unit is configured to reconstruct said comparison signal by implementing an eigenvalue decomposition of said magnetic resonance spectroscopy signal in the time domain, and to generate said comparison signal as a sum of exponential functions.

13. A device as claimed in claim 12 wherein said reconstruction unit is configured to implement an algorithm for said eigenvalue decomposition selected from the group consisting of Hankel Singular Value Decomposition (HSVD) and Linear Prediction Single Value Decomposition (LPSVD).

14. A device as claimed in claim 11 wherein said analysis unit is configured to determine said interference signals by implementing a mathematical analysis of said residual comprising identifying said interference signal as existing in said residual when a range of said residual exceeds a threshold, and to determine said threshold using a noise signal portion of said magnetic resonance spectroscopy signal.

15. A device as claimed in claim 14 wherein said analysis unit is configured to determine said threshold by calculating the standard deviation of said noise signal portion.

16. A device as claimed in claim 11 wherein said analysis unit is configured to reconstruct said comparison signal from only a range of a frequency spectrum of said magnetic resonance spectroscopy signal in which resonance lines are expected.

17. A device as claimed in claim 11 wherein said importation unit is provided with a plurality of magnetic resonance spectroscopy signals and wherein said reconstruction unit is configured, for each of said magnetic resonance spectroscopy signals, to reconstruct said comparison signal, and wherein said processor is configured to calculate said residual for each comparison signal, and wherein said analysis unit is configured to determine said interference signals for each residual and to evaluate a quality of said plurality of magnetic resonance spectroscopy signals by identifying a proportion of said plurality of magnetic resonance spectroscopy signals for which said interference signals exceed a predetermined value.

18. A non-transitory, computer-readable data storage medium encoded with programming instructions, said data storage medium being loaded into a computerized processor that is provided with at least one magnetic resonance spectroscopy signal containing interference signals, and said programming instructions causing said computerized processor to:
reconstruct a comparison signal from said magnetic resonance spectroscopy signal that approximates said magnetic resonance spectroscopy signal and recreates by recreating spectral components of resonance lines in said magnetic resonance spectroscopy signal and that does not include spectral components of said interference signals;
calculate a residual of a difference between said magnetic resonance spectroscopy signal and said comparison signal in frequency representation, said residual containing signal spikes in a degree correlated with said interference signals; and
emit an electrical signal representing the frequency representation of said residual, and determine said interference signals from said signal spikes in said residual represented in said electronic signal.

* * * * *